Figure 1:
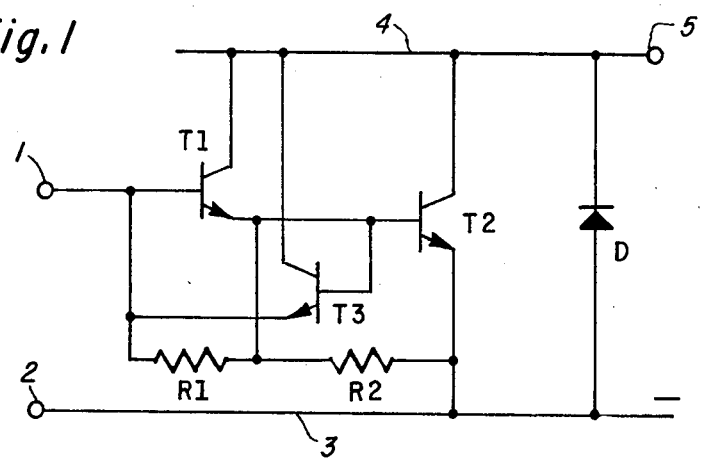

United States Patent [19]

Black et al.

[11] 4,072,981
[45] Feb. 7, 1978

[54] FAST SWITCHING DARLINGTON CIRCUIT

[75] Inventors: Christopher T. Black, Bedford; Anthony Lear, Huntingdon, both of England

[73] Assignee: Texas Instruments Incorporated, Dallas, Tex.

[21] Appl. No.: 742,050

[22] Filed: Nov. 15, 1976

Related U.S. Application Data

[62] Division of Ser. No. 669,585, March 23, 1976, Pat. No. 4,028,561.

[30] Foreign Application Priority Data

Mar. 25, 1975 United Kingdom ............... 12373/75

[51] Int. Cl.$^2$ ........................ H01L 27/02; H03K 3/33
[52] U.S. Cl. ........................... 357/46; 357/51; 357/89; 307/300
[58] Field of Search ............... 357/46, 51, 89; 307/300

[56] References Cited

U.S. PATENT DOCUMENTS 3,836,995 9/1974 Wheatley et al. .................... 357/46
3,889,137 6/1975 Kay ...................................... 307/300

Primary Examiner—Edward J. Wojciechowicz
Attorney, Agent, or Firm—Richard L. Donaldson; James T. Comfort; Rene' E. Grossman

[57] ABSTRACT

A completely integrated npn Darlington stage is provided using an n-type film deposited on an n+ substrate. A p-type boron base is first partially diffused into the n layer, then an oxide window is cut into the oxide formed during the base diffusion, in the area designated for the speedup transistor. A high temperature boron deposition is performed in the oxide window, and the base diffusion completed. The times of the base diffusion steps are chosen so that the penetration of the more lightly doped region slightly exceeds that of the heavily doped region. Oxide windows are then cut for the driver, output and speedup device emitters and the emitter diffusion performed in standard manner. Fabrication is completed using normal single diffused techniques. The effect of the heavy doping of the base region of the speedup transistor is to create a very low gain transistor which has a BV$_{CEO}$ nearly equal to the BV$_{CEX}$ rating.

7 Claims, 3 Drawing Figures

FAST SWITCHING DARLINGTON CIRCUIT

This is a division of application Ser. No. 669,585, filed Mar. 23, 1976 now Pat. No. 4,028,561.

This invention relates to a fast switching output stage formed by transistors connected together in a darlington configuration.

When two high voltage power transistors are connected together in a darlington configuration, for example, for driving the horizontal scan coils of a cathode-ray tube, it is necessary to include a diode from the emitter to the base of the driver transistor to remove the charge carriers stored in the base and collector of the output transistor when the circuit is turned off. If this diode is not provided the rapid switching of the collector current of the output transistor required for the satisfactory operation of the line scanning circuit is not obtained because of the time required to discharge the charge carriers stored in the base and collector of the output transistor.

In the manufacture of an integrated circuit including the driver transistor of a darlington circuit, it is clearly desirable if possible to include in the integrated circuit the diode for discharging the base of the output transistor. However, it is not possible to incorporate such a diode in an integrated circuit by conventional techniques used for producing high voltage power transistors. The processes used to form the collector-base junction of the transistors cannot be used to form the diode. The diode could be replaced by the base-emitter diode of a transistor having its base connected to the base of the output transistor, its emitter connected to the base of the drive transistor and its collector to the collectors of both driver and output transistors, but such an arrangement creates three problems. Firstly, the gain of the transistor results in additional current flow out of the input terminal connected to the base of the driver transistor which would slow down the rate of switching off of the circuit. Secondly, the voltage rating of the combined circuit would be limited to the $BV_{CEO}$ rating of the additional transistor rather than the much higher $BV_{CEX}$ rating. Thirdly, in the reverse bias mode any leakage from collector to base of the output transistor would flow into the base of the additional transistor and be multiplied by its gain, thus giving unacceptably high reverse leakage currents.

It is an object of the present invention to avoid the above difficulties.

According to one aspect of the present invention there is provided a fast switching darlington output circuit formed as an integrated circuit having a driver transistor and an output transistor in darlington connection, a first resistor connected between base and emitter of the driver transistor, a second resistor connected from the emitter of the driver transistor to the emitter of the output transistor, and a speed-up transistor of very low gain having its collector commoned with the collectors of the driver and output transistors, its base connected to the emitter of the driver transistor and its emitter connected to the base of the driver transistor.

According to a second aspect of the invention there is provided a method of fabricating an integrated circuit for use in a circuit according to the preceding paragraph including providing a first layer of a first conductivity type and high resistivity on a second layer of the same conductivity type and low resistivity forming a third layer at the outer surface of the first layer of opposite conductivity type to the first and second layers and high resistivity, forming a first region of the opposite conductivity type and much lower resistivity in the third layer and forming three other regions of the first conductivity type and low resistivity, two of the other regions being formed in the third layer and the third other region being formed in the first region, whereby the two other regions in the third layer form the emitters of the driver and output transistors of which the bases and collectors are formed by parts of the third and first layers respectively, and the third other region forms the emitter of the speed-up transistor of which the base is formed by the first region and part of the third layer and the collector is formed by part of the first layer.

The first layer may be an epitaxial layer formed on a substrate which constitutes the second layer. Alternatively, the second layer may be formed by diffusion of a suitable impurity into a semiconductor body of conductivity type and resistivity suitable for the first layer.

The third layer may be formed by diffusion of a suitable impurity into the first layer, and the first region formed in the third layer by deposition of additional impurity on part of the surface of the third layer during the diffusion process forming the third layer, so that the first region is formed as the diffusion to form the third layer is completed. The three other regions may also be formed by diffusion. As an alternative to diffusion ion beam implantation can be used for any diffusion stage described above.

If the transistors are of the NPN type the first layer would be of N type and the second layer N+ and the bases would be of P type, formed, for example, by the diffusion of boron into the silicon N type layer. A high temperature deposition may be used to deposit the additional impurity for forming the first region, the deposition taking place in a temperature of 1120° C for a relatively short time, for example, 30 minutes. The times of diffusion should be chosen so that penetration into the first layer slightly exceeds that of the heavily doped first region. The transistors may alternatively be of the PNP type in which case the materials referred to above should be modified accordingly.

The effect of the heavy doping of the first region used to form the base of the speed-up transistor is to create a transistor of very low gain, for example, typically 0.1 which has a $BV_{CEO}$ rating typically 90% of the $BV_{CEX}$ rating, so that the limitation resulting from the open circuit base operation of the speed-up transistor is substantially overcome.

The two resistors which are effectively connected from base to emitter of the driver and output transistors respectively serve to prevent any leakage current through the driver transistor being multiplied by the gain of the output transistor. The values of the resistors are chosen to ensure that when the base of the driver transistor is taken negative (in the case of an NPN transistor) with respect to the emitter of the output device not more than 0.5 volts is dropped across the resistor connected from the base to the emitter of the driver transistor; this is necessary to ensure that the speed-up transistor is not turned on in this condition. The two resistors may conveniently be formed by the third layer by arranging the disposition of the emitters of the transistors appropriately.

The integrated circuit may also include an efficiency diode if the circuit is used to drive the horizontal scan coils for a cathode-ray tube. The efficiency diode can easily be formed in the integrated circuit using the collector-base junction processes.

Figure 2:
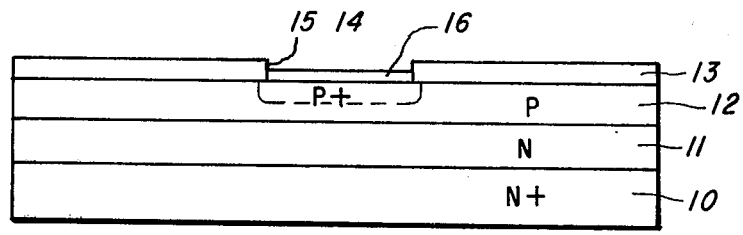
Figure 3:
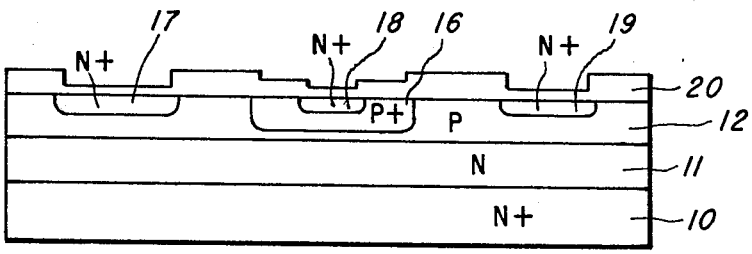

In order that the invention may be fully understood and readily carried into effect, an embodiment will now be described by way of example with references to the accompanying drawings, of which:

FIG. 1 is a circuit diagram of an example of a circuit according to the invention; and FIGS. 2 and 3 represent successive stages in the production of the integrated circuit.

In FIG. 1 transistors T1 and T2 of NPN type are connected in darlington configuration. An input terminal 1 is connected to the base of the driver transistor T1, and an input terminal 2 is connected to a negative supply line 3. The collectors of the transistors T1 and T2 are both connected to an output line 4 joined to an output terminal 5 for connection to, for example, line scan coils of a cathode-ray tube and a positive voltage supply. The emitter of the transistor T1 is connected to the base of the transistor T2 to complete the darlington connection and also to the base of a speed-up NPN transistor T3, the collector of which is also connected to the line 4 and the emitter of which is connected to the base of the transistor T1. Resistors R1 and R2 are connected from emitter to base of transistors T1 and T2 respectively. An efficiency diode D is connected from the line 3 to the line 4.

The circuit of FIG. 1 operates as a conventional darlington output circuit, except when the input terminal 1 is driven negative suddenly for the purpose of turning off transistors T1 and T2 quickly. The carriers stored in the base and collector of the driver transistor T1 are rapidly discharged through the input terminal 1 into the source of the negative driven voltage. The carriers stored in the base and collector of the transistor T2, however, cannot discharge through the emitter base path of the transistor T1 because this is non-conducting but do in fact discharge through the base emitter path of the transistor T3, thus ensuring that both transistors T1 and T2 are switched off at high speed following a rapid negative drive to the input terminal 1. The resistors R1 and R2 are chosen so that using a negative drive signal of predetermined magnitude the voltage at the base of the transistor T3 in steady state conditions is not more than 0.5 volts positive to the voltage at the emitter of the transistor T3, otherwise the transistor T3 will be rendered conducting by the negative drive signal even after the base of transistor T2 has been discharged. As any leakage current from the emitter of the transistor T1 when it is switched off would tend to flow into the base of the transistor T2 and be amplified there, the resistors R1 and R2 also perform the function of absorbing this leakage current by feeding it through the resistor R1 to the input terminal 1 and thence to the source of the negative-going drive signal. Typical values for the resistors R1 and R2 are 100 and 1.5K respectively.

The components shown in FIG. 1 with the possible exception of the efficiency diode D are all embodied in a single integrated circuit constructed using high voltage power transistor techniques.

FIG. 2 shows an early stage in the manufacture of the circuit of FIG. 1 in integrated circuit form. A substrate 10 of N+ conductivity silicon has formed on it an epitaxial layer 11 of N type conductivity, but having a lower doping level than the substrate 10. In order to form the base regions of transistors T1 and T2 a P-type impurity such as boron is deposited on the surface of the layer 11 and is then partially diffused into the epitaxial layer 11 forming the P type region 12. During the diffusion process the surface of the layer 11 becomes oxodised, the film of oxide being indicated at 13 in FIG. 2. In order to form the speed-up transistor a further boron deposition 14 is made at high temperature (say 1120° C) in a relatively short interval of time (say 30 minutes on the surface of the layer 11 through a window 15 opened by normal techniques in the film 13 of oxide.

When the diffusion to form the base region 12 is completed the boron from the deposit 14 is diffused to form a highly doped region within the region 12. This highly doped region is indicated by a dotted line and is marked by a refernce number 16. During this diffusion the surface of the layer 11 is further oxidised producing a film of oxide over the whole of the surface of the layer 11. Because the deposit 14 was put down at high temperature for short time and the diffusion time to form the region 16 is shorter than that used to form the region 12, it follows that the impurity level in the region 16 is higher than that in the region 12 and therefore the region 16 is indicated as being of P+ conductivity type. The surface impurity concentration in the region 16 may, for example, be about $10^{20}$ atoms per cc. whereas that for the layer 12 may be $10^{17}$ atoms per cc.

The formation of the transistors is completed as shown in FIG. 3 by the formation of N type emitter regions 17, 18 and 19 in the base regions 12, 16 and 12 respectively, for example, by diffusion, leaving an oxide film 20 over the surface of the structure. Resistors R1 and R2 may be formed by regions of the layer 12, with appropriate disposition of the emitters of the transistors. Interconnections between the resistors R1 and R2 and the base and emitter regions of transistor T1 and the emitter region of transistor T2, between the base of transistor T1 and the emitter of transistor T3, and the supply conductor 3 may be formed in conventional manner by patterning a metal layer on the silicon oxide layer 20. These processes and the completion of the integrated circuit will not be described in detail, since they can be carried out by conventional techniques.

The efficiency diode D shown in FIG. 1 could be formed in the integrated circuit by the diffusion of a separate P type region similar to the region 12 into the epitaxial layer 11 using the same process. This further P type region would not of course include an N+ type region because it is a diode and not a transistor which is being produced.

Although the invention has been described with reference to a specific example and a specific method of producing the integrated circuit, it will be appreciated that alternative methods could be employed and modifications made to the circuit without departing from the invention. Moreover, the invention is not limited in its application to being a line output stage but could be used for other applications where a rapid switching off of a relatively large current is required to be performed repeatedly.

What is claimed is:

1. A fast switching darlington output circuit comprising first and second superposed semiconductor layers of first conductivity type, said second layer having a higher resistivity than said first layer; a third semiconductor layer having opposite conductivity type on said second layer; said second and third layers providing a common collector and base region respectively for each of first, second and third transistors; a first region of said opposite conductivity type in said third layer and extending to the outer surface thereof, said first region having said opposite conductivity type and lower resistivity than said third layer; three further regions having said first conductivity type, first and second ones of said further regions located in said third layer and extending to said outer surface thereof, the third further region disposed in said first region and extending to the outer surface of said third layer; said two further regions providing emitter regions of said first and second transistors respectively and said third further region providing an emitter region of said third transistor.

2. An integrated circuit according to claim 1, further including fourth and fifth semiconductor regions defining first and second resistors respectively; means connecting said first resistor between the base and emitter of said first transistor; means connecting said second resistor from the emitter of said first transistor to the emitter of said second transistor; and means connecting the base of said first transistor to the emitter of said third transistor.

3. An integrated circuit according to claim 1, wherein the impurity concentration of said first region is about $10^3$ times that in said third layer.

4. An integrated circuit according to claim 1, wherein the second layer is an epitaxial layer on a substrate constituting the first layer.

5. An integrated circuit according to claim 1, wherein the first layer is formed by impurity diffusion into a surface of a semiconductor body, the remainder of said body constituting the first layer.

6. An integrated circuit according to claim 1, wherein the first layer is N+ type conductivity silicon, the second layer is of N type conductivity silicon, the third layer is P type conductivity silicon and the emitter regions are formed of P type conductivity using boron as conductivity determining impurity.

7. An integrated circuit according to claim 1, wherein the transistors are of NPN type.

* * * * *